United States Patent [19]

McCaffrey et al.

[11] 3,838,440

[45] Sept. 24, 1974

[54] A MONOLITHIC MOS/BIPOLAR INTEGRATED CIRCUIT STRUCTURE

[75] Inventors: Terence P. McCaffrey, Mountain View; Paul R. Gray, Orinda, both of Calif.

[73] Assignee: Fairchild Camera and Instrument Corporation, Mountain View, Calif.

[22] Filed: Oct. 6, 1972

[21] Appl. No.: 295,764

[52] U.S. Cl. ........................ 357/43, 357/64, 357/89

[51] Int. Cl. ............................................ H01l 19/00

[58] Field of Search ........ 317/235 D, 235 B, 235 G, 317/235 AQ

[56] References Cited

UNITED STATES PATENTS

| | | | |
|---|---|---|---|
| 3,370,995 | 2/1968 | Lowery et al. | 317/235 D |
| 3,380,153 | 4/1968 | Husher et al. | 317/235 D |
| 3,449,644 | 6/1969 | Nassibian | 317/235 B |
| 3,456,169 | 7/1969 | Klein | 317/235 G |
| 3,466,511 | 9/1969 | Lin | 317/235 G |
| 3,486,950 | 12/1969 | Lesk | 317/235 D |
| 3,585,463 | 6/1971 | Richman | 317/235 AQ |
| 3,602,779 | 8/1971 | Chapron | 317/235 AQ |
| 3,645,808 | 2/1972 | Kamiyama | 317/235 AQ |
| 3,649,843 | 3/1972 | Redwine et al. | 317/235 G |

*Primary Examiner*—Rudolph V. Rolinec
*Assistant Examiner*—William D. Larkins
*Attorney, Agent, or Firm*—Roger S. Borovoy; Alan H. MacPherson

[57] ABSTRACT

A monolithic integrated circuit structure comprises a wafer of semiconductor material including a semiconductor substrate having an epitaxial layer of semiconductor material thereon, a first region and a second region both of a first conductivity type extending downward from a first surface of said wafer at least partially into said epitaxial layer, said first region being surrounded on all sides except said first surface by a semiconductor material of said first conductivity type of lower resistivity than the first region itself and said second region being partly surrounded by semiconductor material of said first conductivity type of lower resistivity than said second region itself, a semiconductor device of a first type formed in the first region of semiconductor material and a semiconductor device of a second type formed in the second region of semiconductor material, and a lifetime-reducing impurity located in said second region of semiconductor material whereby the switching speed of the semiconductor device of the second type in said second region is improved without substantially changing the characteristics of the semiconductor device of the first type in said first region. Typically the semiconductor device of the first type comprises an MOS device having source and drain regions and the semiconductor device of the second type comprises a bipolar transistor. The switching speed of the bipolar transistor is changed due to the fact that the second region in which the bipolar transistor is formed is not completely surrounded by the semiconductor material of said first conductivity type of lower resistivity than the second region itself.

5 Claims, 6 Drawing Figures

A MONOLITHIC MOS/BIPOLAR INTEGRATED CIRCUIT STRUCTURE

BACKGROUND OF THE INVENTION

1. Field of the Invention

This invention is in the field of integrated circuits, particularly integrated circuits requiring both MOS and bipolar transistors to be fabricated in the same monolithic chip of silicon semiconductor material. Such circuitry has application in switching and logic circuits, such as, for example, integrated core driver circuits used by computer manufacturers.

2. Prior Art

Different types of semiconductor devices have been formed on the same monolithic chip of silicon in the past. However, in instances where a compensating impurity such as gold has been required to increase the switching speed of one device, such as a bipolar transistor, one technique that has been employed is to diffuse the gold selectively only in the areas of the bipolar transistors and not in the areas of the other devices. To accomplish this, an oxide layer is grown on the backside of the wafer and used as a mask against the gold diffusion, as shown in FIG. 4 of U.S. Pat. No. 3,423,647. An opening is made in the oxide mask and gold is selectively diffused only in the area underlying the bipolar transistors. In this manner, the gold will not deleteriously affect the leakage current or the threshold voltage characteristics of the other devices.

The disadvantage of the above technique is that a separate oxide growth is required on the backside of the wafer, followed by a masking step prior to the evaporation and the diffusion of the gold layer.

SUMMARY OF THIS INVENTION

The structure of the monolithic MOS/bipolar integrated circuit of the subject invention unexpectedly overcomes the necessity of masking the gold diffusion from the backside of the wafer. Using the structure of the invention, gold can be diffused in the conventional manner over the entire backside of the semiconductor wafer in spite of the fact that the wafer contains both MOS and bipolar integrated circuit devices.

The invented structure comprises a monolithic wafer of semiconductor material having an epitaxial layer on one surface. Prior to the deposition of the epitaxial layer, a pair of heavily doped "buried layers" are formed, typically though not necessarily, by diffusion, in the semiconductor material. It is conventional to form such "buried layers" in the fabrication of bipolar transistors; however, none has been required or used in the prior art in connection with the fabrication of MOS transistors. After the formation of the heavily doped buried layers, a lightly doped epitaxial layer is grown atop the buried layers. The heavily doped buried layers form the bottoms of the pockets in the devices of this invention. The walls of the pockets are formed of heavily doped regions, normally called "sinkers," of the same conductivity type as the buried layers. These "sinkers" are typically formed by diffusing an impurity downwards from the top surface of the wafer until the diffused regions contact the heavily doped buried layers beneath and within the epitaxial layer. Thus the pockets, comprising the buried layers and the sinkers extend at least partially into the epitaxial layer, the pockets being filled with epitaxial semiconductor material of a first conductivity type, and of higher resistivity than the pocket walls (the sinkers and the buried layers together).

An MOS device having a source and a drain region of conductivity type opposite from the conductivity type of the pockets is formed in the semiconductor material in one of the pockets. A bipolar transistor having a collector region of the same conductivity type as used in the pockets is formed in the semiconductor material in the other pocket. In the case of the bipolar transistor, it is not desired to have the collector enclosed by sinkers since the gold is useful in the bipolar collector area.

In the structure of the invention having these two heavily doped pockets, one for the MOS device and one for the bipolar device, the compensating impurity such as gold is diffused uniformly from the back surface of the wafer into the semiconductor material comprising the bottom of the pockets. It has been unexpectedly found that material of the first conducting type within the pocket containing the bipolar transistor, will be affected, thus substantially increasing the switching speeds of the bipolar transistors while at the same time, the MOS device is not similarly affected and thus neither the leakage current nor the threshold voltage characteristics of the MOS transistor will be adversely affected. In effect, the buried layer and "sinkers," together making up the pocket of the MOS device, act as a shield against this gold harming the MOS devices. This was different from what was expected from the prior art particularly U.S. Pat. No. 3,423,647, where particular precautions were taken to mask against the diffusion of the gold into a selected area rather than to diffuse gold uniformly as was found possible in the structure of the subject invention. Description of the Figures:

DETAILED DESCRIPTION OF THE INVENTION

Making reference to the drawings, a detailed description of the structure of the invention, along with its method of manufacture will be set forth.

Figure 3A:
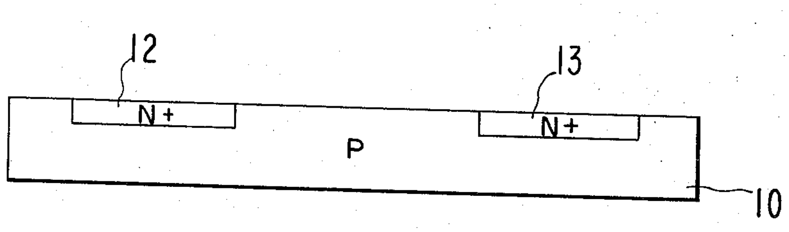
FIGS. 3A–3D show the method of making the structure of the invention.

Referring to FIGS. 3A to 3D, the method of making the structure of the invention can be best explained. Although this invention will be explained with silicon as the semiconductor material, other semiconductor material can also be used with this invention. As is conventional in the semiconductor industry, particularly in the fabrication of bipolar circuits, the starting material for the process is a substrate 10 of semiconductor material. In explaining this invention, this substrate will be of a p-type material although by reversing all the conductivity types in the subsequent description, this wafer would then be of n-type material. Conventionally, substrate 10 is masked and buried layers 12 and 13 of n-type conductivity opposite to the conductivity type of substrate 10 are formed in substrate 10 in a conventional manner. Typically layers 12 and 13 are diffused although they could be ion-implanted. The oxide masking material is removed as shown in FIG. 3A so that an epitaxial layer 14 may be deposited on the bare silicon surface of p-type substrate 10 containing buried layers 12 and 13 of the opposite conductivity type. Epitaxial layer 14 is of the opposite conductivity type from that of substrate 10 and is of higher resistivity than the buried layers 12 and 13. Layer 14 is commonly designated as "n-type" material.

Next, p-type isolation region 9 is formed, typically by diffusion, completely through n-type epitaxial layer 14 into contact with p-type substrate 10 to isolate one device from the next. This step is conventional.

Figure 1:
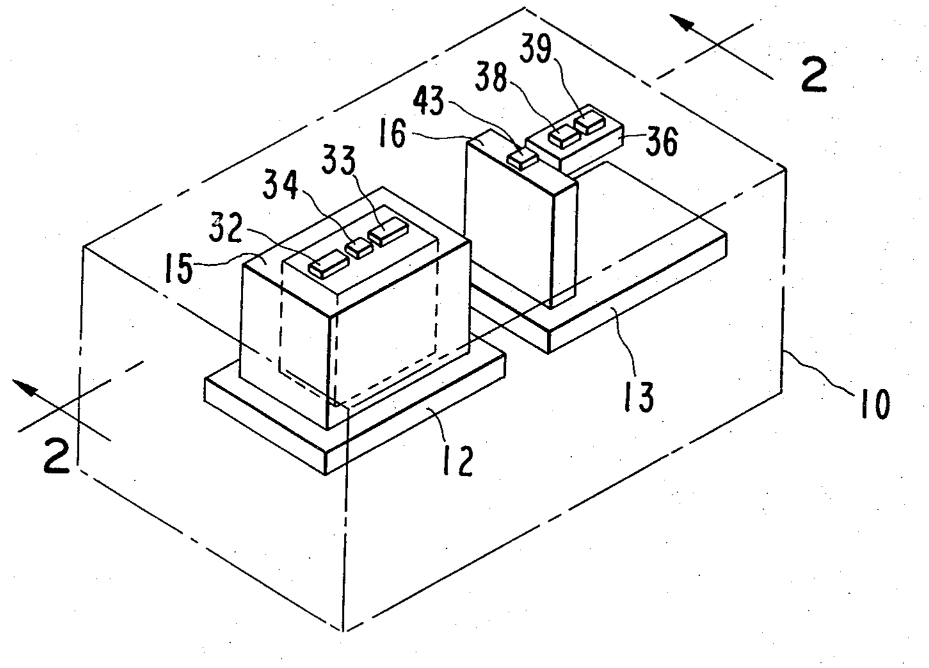
FIG. 1 is a pictorial view of the monolithic MOS/-bipolar structure of the subject invention.
Figure 3B:
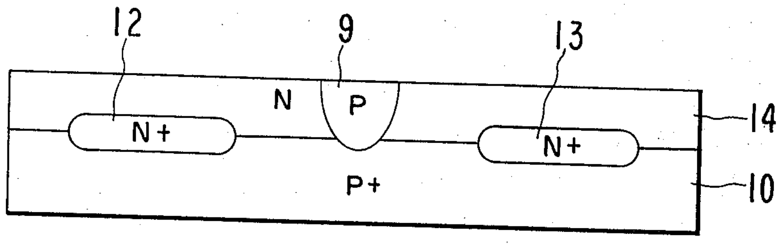
Figure 3C:
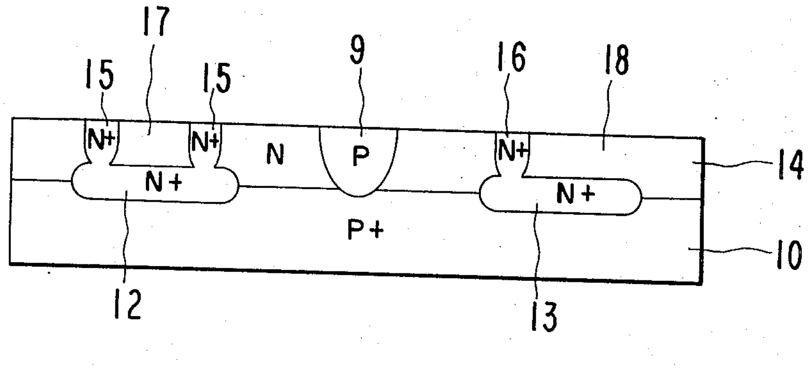

To form the sides of the pockets of the invention, regions 15 and 16 of heavily doped n-type material are formed in a conventional manner from the top surface of layer 14, as shown in FIG. 3C. Region 15 forms a closed path such as a circle or square when viewed from the top of the wafer, and as illustrated pictorially in FIG. 1. Sinker region 16, for the bipolar device can be any shape so long as it comes into contact with buried layer 13. These sinker regions are also heavily doped, and are of the same conductivity type as buried layers 12 and 13 and as epitaxial layer 14.

Region 15 and buried layer 12, together form a first pocket of heavily doped semiconductor material which is filled with the higher resistivity, more lightly doped n-type material of region 17 (FIG. 3C) of epitaxial layer 14. Similarly, buried layer 13 and sinker region 16, both N+, together form a second pocket of semiconductor material which is adjacent to and at least partially surrounds the higher resistivity, more lightly doped material of region 18 of epitaxial layer 14.

Figure 3D:
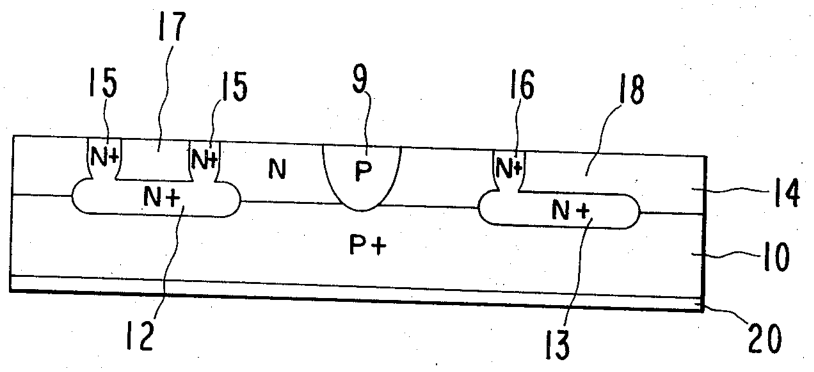

If desired at this stage of the process, a layer of gold 20 may be evaporated on the backside of the wafer (comprising substrate 10 and layer 14), as shown in FIG. 3D. This gold will be diffused from the backside of the wafer into the semiconductor material at later stages of the process when the wafer is heated at various times, as is conventional during the formation of the active semiconductor devices. Alternatively, the layer of gold can be deposited at any intermediate stage of the subsequent formation of the active semiconductor devices. For example, the gold layer can be deposited between the emitter diffusion and the base diffusion of the bipolar transistors; or it can be deposited at any stage of the formation of the MOS transistors. For example, the gold can be evaporated prior to the oxidation required to grow oxide gate material on the MOS device; or, in many conventional MOS devices having two oxide layers, one thick oxide layer and one thin gate oxide layer, the gold can be deposited on the backside of the wafer just prior to the second oxidation required to grow the thinner gate oxide. In this last example, the gold layer is evaporated on the backside just prior to the last high temperature step required to drive in the emitter of the bipolar transistors and to getter the gate oxide of the MOS devices. These steps are conventional processing steps in the fabrication of bipolar and MOS transistors and will be well understood to those skilled in the art.

After the gold diffusion and the completion of the MOS and biplolar transistors in a conventional manner, the metalization pattern is deposited on the top surface of the device to make the electrical contacts in a manner well known in the art.

Figure 2:
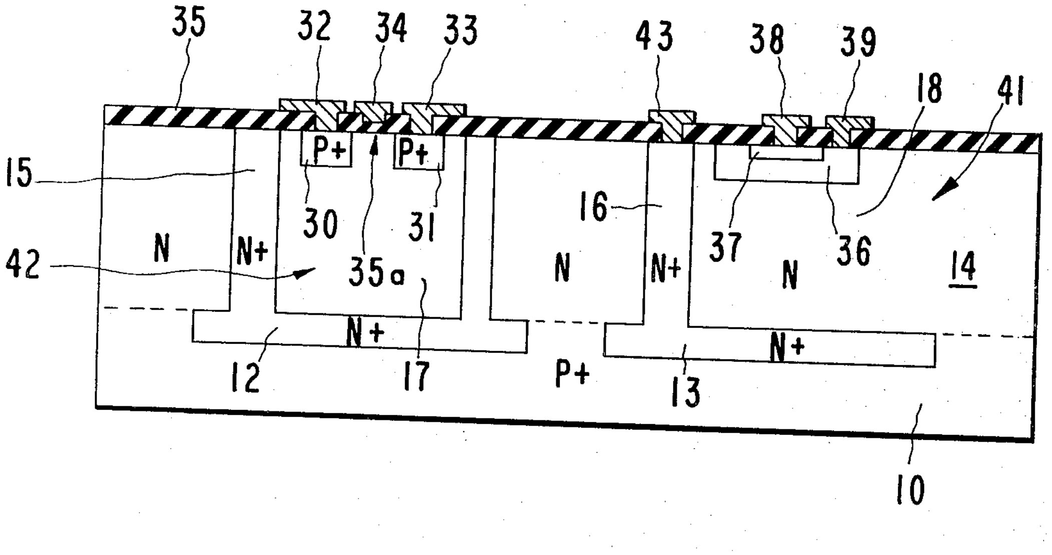
FIG. 2 is a cross-section along the lines 2—2 of the structure of Fig. 1.

A completed device is shown in FIG. 2. The MOS device 42 has source and drain regions 30 and 31 formed in pocket 17. Source contact 32 and drain contact 33 are used to make electrical contact to these source and drain regions. The gate contact 34 lies atop the gate portion 35*a* of layer 35, as is conventional in MOS devices. The bipolar transistor is formed in pocket 18. The collector of the bipolar transistor includes buried layer 13 as well as the semiconductor material within pocket 18 above the buried layer 13. The base of the transistor is p-type region 36 and the emitter is n-type region 37. The bipolar device has an emitter contact 38, a base contact 39 and a collector contact 43.

It has been determined that the buried layer 12, forming the bottom of the pocket 17 containing the MOS device, along with the sinker region 15, forming the wall of the pocket 17 containing the MOS device unexpectedly protect the device from the otherwise deleterious effects of the gold diffusion. Accordingly, while the switching speed of the bipolar transistor 41 is increased by the effect of the gold on the collector region 18, MOS transistor 42 still maintains the desirable characteristics of a low threshold voltage and a low leakage current.

In the specific example of the invention, buried layers 12 and 13 are formed by the diffusion of arsenic to achieve a sheet resistivity of 10–12 ohms per square. The oxide formed during the arsenic diffusion is then stripped (as shown in FIG. 3A without the oxide) and the arsenic is driven in using a drive diffusion to form regions 12 and 13. The n-type epitaxial layer 14 is grown atop the buried layers 12 and 13 and is twelve microns thick and has a sheet resistivity of 0.4–0.6 ohms per square. This epitaxial layer is reoxidized for masking the diffusion of isolation region 9. Isolation region 9 is formed by the diffusion of boron through an oxide mask in a conventional manner. The resulting region after the removal of the mask is shown in FIG. 3B.

An additional oxide masking is then performed for the diffusion of sinker regions 15 and 16. These are formed by the predeposition and diffusion of phosphorus using a 3 hour diffusion at 1250°C. At this point, after the removal of the oxide mask, the structure is shown in FIG. 3C.

In this specific example, the next step employed (prior to the evaporation and diffusion of gold) is the formation of the base region 36 of the bipolar transistor 41 as shown in FIG. 2. During the same step, source and drain regions 30 and 31 of MOS transistor 42 of FIG. 2 are simultaneously diffused. A predeposition of boron is employed for these regions, followed by a one hour oxidation and drive diffusion.

Next an oxide mack is again used to predeposit phosphorus for the n-type emitter region 37 shown in FIG. 2. At this point, prior to the drive diffusion used to drive in the n-type emitter region 37, gold is evaporated on the backside of the wafer. Then a low temperature steam oxidation is performed to grow an additional 2,000 angstroms of oxide on the topside of the wafer. The oxide layer in the area beneath the yet-to-be-formed gate contact 34 of the MOS transistor 42 is removed by etching using a conventional masking and etching step. Then a second, short low-temperature steam oxidation is performed to grow 1,000 angstroms of new oxide 35*a* beneath the gate 34 of MOS device 42. Then a ten minute high temperature diffusion is performed in a nitrogen atmosphere (to avoid further oxidation), followed by an additional two minute diffusion in the presence of phosphorus oxychloride at high temperature. All of the above high temperature steps which are carried out subsequent to the evaporation of the gold layer 20 (FIG. 3D) on the backside of the wafer, serve to drive the gold into the wafer, and also to getter the gate oxide layer 35*a* beneath gate contact 34.

Using the above procedure, an MOS device was fabricated having a threshold voltage between 3.5 and 6 volts. The npn transistor 41 has an $h_{FE}$ of 50 to 100, a $\tau_s$ of 5 ns. and an $f_t$ of 500 megacycles.

The advantage of the structure and process of this invention is that it is compatible with any gold doping techniques, including the backside diffusion of gold during the base diffusion, or between the base predeposition and the base diffusion.

As is clear from the above, the process allows the manufacture of MOS devices in a manner totally compatible with the normal procedures used in gold doped bipolar devices. No additional steps are required, and it has been unexpectedly discovered that the resulting MOS devices made in accordance with the invention are not deleteriously affected by the diffusion of gold. By surrounding the MOS with n+ semiconductor material, the MOS device is apparently isolated from the gold and thus its threshold voltage is not affected by the gold doping.

It should be noted that the MOS transistor 42 (FIG. 2) could have been a bipolar transistor or any other semiconductor device capable of being formed in material 17. In such an event, the device so formed would not be affected by the gold doping.

In addition, while this invention has been described with respect to gold doping and structure for selectively controlling the regions of a semi-conductor device containing gold, the structure of this invention can be used to selectively isolate regions of semiconductor material from any other dopant which is affected by low-resistivity semiconductor material in a manner similar to gold.

We claim:

1. A monolithic integrated circuit including an MOS and a bipolar transistor, which comprises:

a wafer comprising a substrate of semiconductor material of P conductivity type having an epitaxial layer of semiconductor material of N conductivity type thereon;

a first and a second region both of said N conductivity type included within said epitaxial layer extending downwardly from a first surface of said wafer at least partially into said epitaxial layer, said first region being surrounded on all sides except said first surface by a region of semiconductor material of said N conductivity type of lower resistivity than the first region itself and said second region being partly surrounded by semiconductor material of said N conductivity type of lower resistivity than said second region itself, wherein a portion of said lower resistivity region of semiconductor material is doped with arsenic;

an MOS device having source and drain regions of said P conductivity type formed in the first region of semiconductor material;

a semiconductor device of another type than MOS formed in the second region of semiconductor material; and a lifetime-reducing impurity located in said second region of semiconductor material whereby the switching speed of the semiconductor device of said other type in said second region is improved without substantially changing the characteristics of the semiconductor device of a first type in said first region.

2. The structure of claim 1 wherein said lifetime-reducing impurity is gold.

3. Structure as in claim 1 wherein said semiconductor device of a second type comprises a bipolar transistor having a collector region of said N conductivity type formed in said second region of said semiconductor material.

4. Structure as in claim 1 wherein the bottom portion of said semiconductor material of said N conductivity type of lower resistivity than the first region itself surrounding said first region comprises a portion of said epitaxial layer adjacent said substrate and a contiguous portion of the substrate.

5. Structure as in claim 1 wherein the portion of said semiconductor material of said N conductivity type partly surrounding said second region comprises a portion of said epitaxial layer adjacent said substrate and the contiguous portion of said substrate.

* * * * *